US010355667B2

(12) United States Patent
Takata (10) Patent No.: US 10,355,667 B2
(45) Date of Patent: Jul. 16, 2019

(54) LADDER FILTER, ELASTIC WAVE FILTER MODULE, AND DUPLEXER (71) Applicant: Murata Manufacturing Co., Ltd., Nagaokakyo-shi, Kyoto-fu (JP)

(72) Inventor: Toshiaki Takata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 36 days.

(21) Appl. No.: 15/610,872

(22) Filed: Jun. 1, 2017

(65) Prior Publication Data
US 2017/0272057 A1 Sep. 21, 2017

Related U.S. Application Data (63) Continuation of application No. PCT/JP2015/083433, filed on Nov. 27, 2015.

(30) Foreign Application Priority Data

Dec. 4, 2014 (JP) .................. 2014-245793

(51) Int. Cl.
H03H 9/64 (2006.01)
H03H 9/72 (2006.01)
(Continued)

(52) U.S. Cl.
CPC ......... *H03H 9/6406* (2013.01); *H01L 41/047* (2013.01); *H01L 41/107* (2013.01);
(Continued)

(58) Field of Classification Search
CPC ............ H03H 9/70; H03H 9/72; H03H 9/725
(Continued)

(56) References Cited

U.S. PATENT DOCUMENTS 6,043,725 A * 3/2000 Taguchi ................... H03H 9/72
333/132
7,893,794 B2 * 2/2011 Ohashi ..................... H03H 7/38
333/133
(Continued)

FOREIGN PATENT DOCUMENTS

JP 2005-045475 A 2/2005
JP 2008-035358 A 2/2008
(Continued)

OTHER PUBLICATIONS

Official Communication issued in corresponding Korean Patent Application No. 10-2017-7014881, dated Apr. 19, 2018.
(Continued)

*Primary Examiner* — Dean O Takaoka
(74) *Attorney, Agent, or Firm* — Keating & Bennett, LLP (57) ABSTRACT A ladder filter defines a transmission filter and has a structure such that a resonator located closest to an input terminal is a parallel-arm resonator, and the parallel-arm resonator located closest to the input terminal includes a plurality of division resonators connected in parallel. At least one division resonator has a resonant frequency and an anti-resonant frequency that are located outside a passband of the ladder filter, and the remaining division resonators and parallel-arm resonators each have an anti-resonant frequency located within the passband.

18 Claims, 6 Drawing Sheets (51) Int. Cl.
*H03H 7/38* (2006.01)
*H01L 41/047* (2006.01)
*H01L 41/107* (2006.01)

(52) U.S. Cl.
CPC ............ *H03H 7/38* (2013.01); *H03H 9/6483* (2013.01); *H03H 9/725* (2013.01)

(58) Field of Classification Search
USPC .......................................................... 333/133
See application file for complete search history.

(56) References Cited

U.S. PATENT DOCUMENTS

| | | | | |
|---|---|---|---|---|
| 8,269,577 | B2 * | 9/2012 | Inoue | H03H 9/547 |
| | | | | 333/133 |
| 9,035,722 | B2 * | 5/2015 | Hara | H03H 9/725 |
| | | | | 333/133 |
| 9,325,294 | B2 * | 4/2016 | Silver | H03H 9/465 |
| 2005/0025324 | A1 | 2/2005 | Takata | |
| 2008/0024042 | A1 | 1/2008 | Isobe et al. | |
| 2012/0293277 | A1 * | 11/2012 | Hara | H03H 9/0576 |
| | | | | 333/133 |
| 2014/0049340 | A1 * | 2/2014 | Inoue | H03H 9/25 |
| | | | | 333/133 |
| 2014/0218129 | A1 | 8/2014 | Fujiwara et al. | |

FOREIGN PATENT DOCUMENTS

| | | |
|---|---|---|
| JP | 2008-067413 A | 3/2008 |
| JP | 2014-068123 A | 4/2014 |
| JP | 2014-099842 A | 5/2014 |
| WO | 2013/080461 A1 | 6/2013 |

OTHER PUBLICATIONS

Official Communication issued in International Patent Application No. PCT/JP2015/083433, dated Jan. 12, 2016.

* cited by examiner

LADDER FILTER, ELASTIC WAVE FILTER MODULE, AND DUPLEXER

CROSS REFERENCE TO RELATED APPLICATIONS

This application claims the benefit of priority to Japanese Patent Application No. 2014-245793 filed on Dec. 4, 2014 and is a Continuation Application of PCT Application No. PCT/JP2015/083433 filed on Nov. 27, 2015. The entire contents of each application are hereby incorporated herein by reference.

BACKGROUND OF THE INVENTION

1. Field of the Invention

The present invention relates to a ladder filter including a plurality of elastic wave resonators, an elastic wave filter module, and a duplexer.

2. Description of the Related Art

Conventionally, a duplexer is connected to an antenna end of mobile phones. A duplexer described in Japanese Unexamined Patent Application Publication No. 2008-67413 includes a transmission filter that is a ladder filter including a plurality of surface acoustic wave resonators. An amplifier is connected to a transmission terminal, which is an input terminal of the ladder filter. For impedance matching, a matching circuit is connected between the input terminal of the ladder filter and the amplifier. The matching circuit includes a stripline and an open stub.

Duplexers such as the one described in Japanese Unexamined Patent Application Publication No. 2008-67413 require a matching circuit to achieve impedance matching between a ladder filter and an amplifier. Thus, the dimensions of such duplexers are increased by this matching circuit.

SUMMARY OF THE INVENTION

Preferred embodiments of the present invention provide ladder filters that enable simplification or omission of a matching circuit, elastic wave filter modules including the ladder filters, and duplexers including the elastic wave filter modules as transmission filters.

A ladder filter according to a preferred embodiment of the present invention has a passband and includes an input terminal, an output terminal, a series-arm resonator provided at a series arm connecting the input terminal and the output terminal to each other, and a plurality of parallel-arm resonators provided at respective parallel-arms each connecting the series arm and a ground potential to each other, the series-arm resonator and the plurality of parallel-arm resonators each being an elastic wave resonator, wherein the plurality of parallel-arm resonators include an input-terminal-side parallel-arm resonator located closest to the input terminal, wherein the input-terminal-side parallel-arm resonator includes a plurality of division resonators connected in parallel, wherein at least one division resonator among the plurality of division resonators has a resonant frequency and an anti-resonant frequency that are located outside the passband, and the rest of the plurality of division resonators other than the at least one division resonator and the rest of the plurality of parallel-arm resonators other than the input-terminal-side parallel-arm resonator each have an anti-resonant frequency that is located within the passband.

In a certain specific aspect of a ladder filter according to a preferred embodiment of the present invention, the at least one division resonator has an electrode finger pitch that is different from electrode finger pitches of the rest of the plurality of division resonators and the rest of the plurality of parallel-arm resonators.

In another specific aspect of a ladder filter according to a preferred embodiment of the present invention, the ladder filter includes a piezoelectric substrate, and a plurality of IDT electrodes disposed on the piezoelectric substrate.

In another specific aspect of a ladder filter according to a preferred embodiment of the present invention, an impedance of the ladder filter seen from the input terminal is lower than an impedance of the ladder filter seen from the output terminal.

An elastic wave filter module according to a preferred embodiment of the present invention includes the ladder filter according to one of the above-described preferred embodiments of the present invention, and an amplifier connected to the input terminal of the ladder filter.

In a certain specific aspect of an elastic wave filter module according to a preferred embodiment of the present invention, the ladder filter is a first electronic component chip including the piezoelectric substrate, and the amplifier is a second electronic component chip including an amplifier substrate. In this case, a small elastic wave filter module is able to be obtained by mounting the first electronic component chip and the second electronic component chip on a case substrate, for example.

In another specific aspect of an elastic wave filter module according to a preferred embodiment of the present invention, the first electronic component chip and the second electronic component chip are mounted on a case substrate. In this case, the first and second electronic component chips are mounted on the case substrate to be integrated into a single component. Accordingly, the elastic wave filter module is able to be handled as a single component.

In another specific aspect of an elastic wave filter module according to a preferred embodiment of the present invention, the elastic wave filter module further includes a matching circuit connected between the ladder filter and the amplifier. As described above, the elastic wave filter module may further include a matching circuit. In this case, since impedance matching between the ladder filter and the amplifier is achieved in accordance with the present invention, a large matching circuit is not needed.

A duplexer according to a preferred embodiment of the present invention includes a transmission filter including the elastic wave filter module according to one of the above-described preferred embodiments of the present invention, and a reception filter. Since the dimensions of the transmission filter are able to be reduced, the dimensions of the entire duplexer are able to be reduced.

In a certain specific aspect of a duplexer according to a preferred embodiment of the present invention, the resonant frequency of the at least one division resonator having the resonant frequency and the anti-resonant frequency that are located outside the passband is located within a passband of the reception filter. In this case, it becomes less likely that noise from the amplifier enters the reception filter side.

With the ladder filters according to preferred embodiments of the present invention, impedance matching is achieved by the capacitive property of the at least one division resonator. Thus, a matching circuit for impedance matching is able to be omitted or simplified.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is disclosed below through a description of specific preferred embodiments of the present invention with reference to the drawings.

Note that each preferred embodiment described herein is illustrative and a configuration can be partially replaced with or combined with another configuration between different preferred embodiments.

Figure 1:
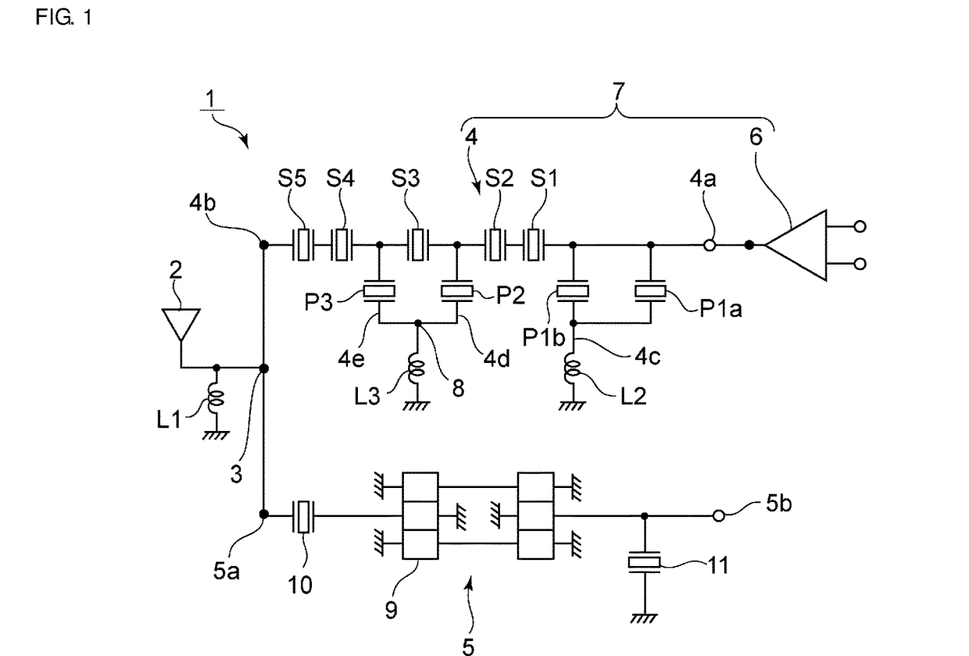
FIG. 1 is a circuit diagram of a duplexer according to a first preferred embodiment of the present invention.

FIG. 1 is a circuit diagram of a duplexer according to a first preferred embodiment of the present invention. A duplexer 1 includes an antenna terminal 3 that is connected to an antenna 2. An inductor L1 is connected between the antenna terminal 3 and a ground potential. A transmission filter 4 and a reception filter 5 are connected to the antenna terminal 3. The transmission filter 4 includes an input terminal 4a, which is a transmission terminal, and an output terminal 4b. The output terminal 4b is connected to the antenna terminal 3. An amplifier 6 is connected to the input terminal 4a. The amplifier 6 amplifies a transmission signal to be supplied to the transmission filter 4.

Figure 2:
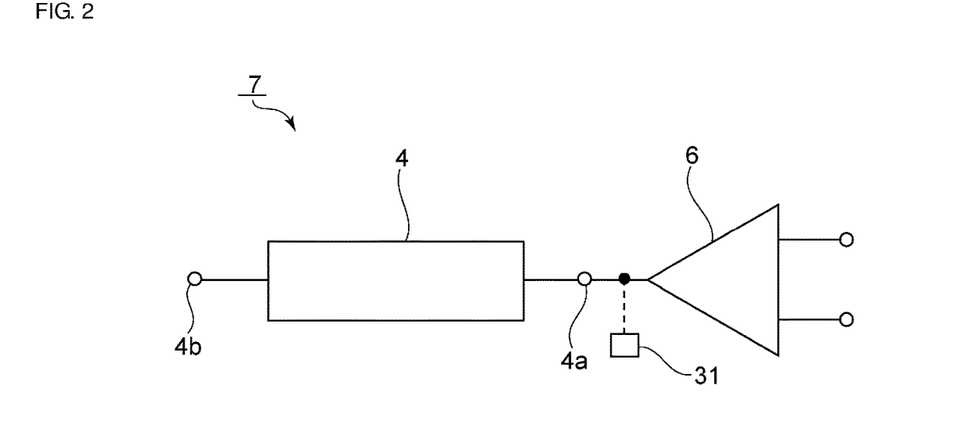
FIG. 2 is a schematic configuration diagram of an elastic wave filter module including a transmission filter according to the first preferred embodiment of the present invention and an amplifier.

The transmission filter 4 and the amplifier 6 define an elastic wave filter module 7 according to a preferred embodiment of the present invention. FIG. 2 is a schematic configuration diagram of the elastic wave filter module 7.

Referring back to FIG. 1, the transmission filter 4 is a ladder filter according to a preferred embodiment of the present invention. Specifically, a plurality of series-arm resonators S1 to S5 are disposed at a series arm connecting the input terminal 4a and the output terminal 4b to each other.

Each of the plurality of series-arm resonators S1 to S5 is a surface acoustic wave resonator, which is an elastic wave resonator.

First to third parallel arms 4c to 4e are provided, each of which connects the series arm and the ground potential to each other. The first parallel arm 4c connects the input terminal 4a and the ground potential to each other. The parallel arm that is located closest to the input terminal 4a is the first parallel arm 4c. The first parallel arm 4c includes a first division resonator P1a and a second division resonator P1b, which are obtained by parallel division of a parallel-arm resonator. Specifically, the input-terminal-side parallel-arm resonator located closest to the input terminal 4a is divided into the first division resonator P1a and the second division resonator P1b by parallel division. The first division resonator P1a and the second division resonator P1b are connected in parallel in the first parallel arm 4c. The term "parallel division" refers to a configuration in which a parallel-arm resonator is divided into a plurality of division resonators that are connected in parallel. No series-arm resonator is present between division resonators obtained by parallel division according to a preferred embodiment of the present invention.

In the first parallel arm 4c, an inductor L2 is connected between the ground potential and end portions of the first and second division resonators P1a and P1b that are closer to the ground potential. The second parallel arm 4d connects a node between the series-arm resonator S2 and the series-arm resonator S3 to the ground potential. The second parallel arm 4d includes a parallel arm resonator P2. The third parallel arm 4e connects a node between the series-arm resonator S3 and the series-arm resonator S4 to the ground potential. The third parallel arm 4e includes a parallel-arm resonator P3.

End portions of the parallel-arm resonators P2 and P3 that are located closer to the ground potential are connected via a common node 8. That is, the second parallel arm 4d and the third parallel arm 4e are commonly connected via the common node 8. An inductor L3 is connected between this common node 8 and the ground potential. The first and second division resonators P1a and P1b and the parallel-arm resonators P2 and P2 are each a surface acoustic wave resonator.

Features of the elastic wave filter module 7 according to the present preferred embodiment are that the resonator located closest to the input terminal 4a of the transmission filter 4 is not a series-arm resonator but is a parallel-arm resonator and that this parallel-arm resonator is subjected to parallel division. In addition, the first division resonator P1a has a resonant frequency and an anti-resonant frequency that are located outside a passband of the transmission filter 4.

Accordingly, the first division resonator P1a generates as capacitance in the passband of the transmission filter 4 as is apparent from an example described below and thus achieves impedance matching between the amplifier 6 and the transmission filter 4. Therefore, a matching circuit that is generally provided between the transmission filter 4 and the amplifier 6 is able to be omitted in the elastic wave filter module 7. Consequently, the dimensions of the elastic wave filter module 7 are able to be reduced.

The second division resonator P1b, which is the rest of the plurality of division resonators of the parallel-arm resonator other than the first division resonator P1a, and the parallel-arm resonators P2 and P3 each have an anti-resonant frequency located within the passband of the transmission filter 4. That is, the second division resonator P1b, which is the rest of the plurality of division resonators obtained by parallel division other than the first division resonator P1a, and the parallel-arm resonators P2 and P3, which are the rest of the plurality of parallel-arm resonators other than the parallel-arm resonators P1a and P1b, form the passband of the transmission filter 4.

In this preferred embodiment, the parallel-arm resonator located closest to the input terminal 4a is divided into the first and second division resonators P1a and P1b by parallel division. In various preferred embodiments of the present invention, the number of division resonators obtained by parallel division is not limited to 2. That is, the parallel-arm resonator located closest to the input terminal 4a may be divided into three or more division resonators by parallel division, for example. In either case, at least one division resonator among the plurality of division resonators is preferably used as the first division resonator, and the rest of the division resonators other than the first division resonator may be used in a configuration similar to that of the second division resonator described above.

Preferably, a single first division resonator P1a and a single second division resonator P1b are provided as in the present preferred embodiment. With this configuration, the dimensions are able to be reduced.

The reception filter 5 illustrated in FIG. 1 includes a longitudinally-coupled-resonator surface acoustic wave filter 9. The reception filter 5 includes an input terminal 5a and an output terminal that serves as a reception terminal 5b. An elastic wave resonator 10 is connected between the input terminal 5a and the longitudinally-coupled-resonator surface acoustic wave filter 9. In addition, an elastic wave resonator 11 is connected between the ground potential and a node between the longitudinally-coupled-resonator surface acoustic wave filter 9 and the reception terminal 5b.

In various preferred embodiments of the present invention, the circuit configuration of the reception filter 5 is not limited to this one and can be modified appropriately. The reception filter 5 may be a ladder filter including a plurality of elastic wave resonators, for example.

An example of a physical structure of the elastic wave filter module 7 according to the present preferred embodiment will be described with reference to FIGS. 3 and 4.

Figure 3:
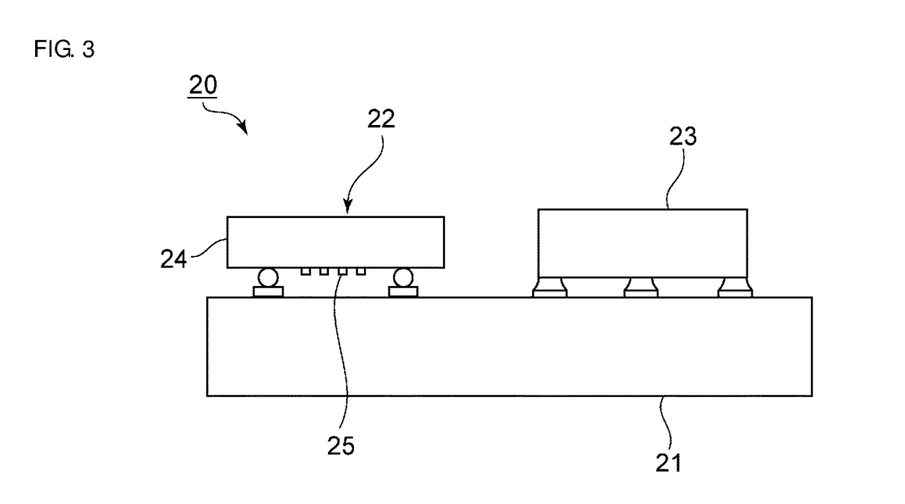
FIG. 3 is a frontal view of a filter module device according to the first preferred embodiment of the present invention.

FIG. 3 is a frontal view of a filter module device 20 in which the duplexer 1 and the amplifier 6 are disposed. The filter module device 20 includes a case substrate 21. A first electronic component chip 22 and a second electronic component chip 23 are mounted on the case substrate 21. The first electronic component chip 22 includes the transmission filter 4 and the reception filter 5 illustrated in FIG. 1. The second electronic component chip 23 includes the amplifier 6. In the filter module device 20, the first electronic component chip 22 and the second electronic component chip 23 are mounted on the case substrate 21 to be integrated into a single component. Accordingly, the circuit configuration illustrated in FIG. 1 is implemented by the filter module device 20 that is a single electronic component. Thus, the duplexer 1 and the amplifier 6 are able to be easily mounted in mobile phones or the like.

The first electronic component chip 22 includes a piezoelectric substrate 24. IDT electrodes 25 are provided on one of principal surfaces of the piezoelectric substrate 24. The IDT electrodes 25 define surface acoustic wave resonators. FIG. 4 is a schematic plan view of an electrode structure on the one principal surface of this piezoelectric substrate 24. The series-arm resonators S1 to S5, the first and second division resonators P1a and P1b, and the parallel-arm resonators P2 and P3 described above are provided on the one principal surface of the piezoelectric substrate 24. FIG. 4 schematically illustrates a portion where each resonator is provided by using a symbol of X enclosed in a rectangular frame. In practice, each surface acoustic wave resonator is a surface acoustic wave resonator that includes an IDT electrode and reflectors disposed on the respective sides of the IDT electrode along the propagation direction of the surface acoustic wave.

In addition, the reception filter 5 denoted by a dash line is connected to the antenna terminal 3 on the piezoelectric substrate 24. A portion where the reception filter 5 is provided is illustrated only as a region by using the dash line.

Figure 4:
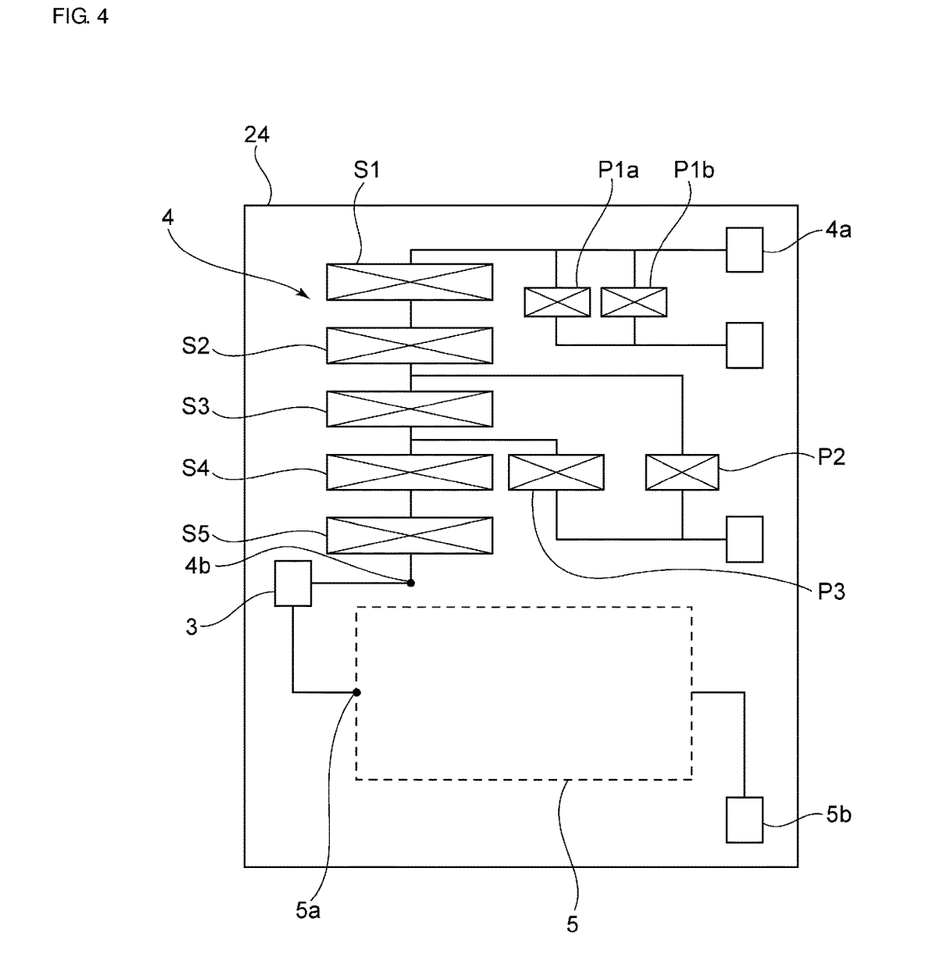
FIG. 4 is a schematic plan view illustrating an electrode structure on a piezoelectric substrate of the duplexer according to the first preferred embodiment of the present invention.

Note that the first electronic component chip 22 includes both the transmission filter 4 and the reception filter 5 in FIGS. 3 and 4. Alternatively, the first electronic component chip 22 may include the transmission filter 4 alone in the present invention. That is, the elastic wave filter module 7 is not limited to the transmission filter of the duplexer and is just required to have a circuit configuration in which a ladder filter and an amplifier are connected.

In addition, the elastic wave resonators are not limited to surface acoustic wave resonators, and other elastic wave resonators such as boundary acoustic wave resonators and bulk wave resonators using a piezoelectric thin film may be used.

In this preferred embodiment, different resonance characteristics of the first division resonator P1a and the second division resonator P1b are implemented by structuring the IDT electrode of the first division resonator P1a and the IDT electrode of the second division resonator P1b to have different electrode finger pitches. That is, the electrode finger pitch of the first division resonator P1a is preferably set so that the resonant frequency and the anti-resonant frequency of the first division resonator P1a are located outside the passband of the transmission filter 4.

Other methods such as changing the metallization ratio or the film thickness of the electrode fingers of the IDT electrodes may be used as the configuration to locate the resonant frequency and the anti-resonant frequency of the first division resonator P1a outside the passband.

In addition, the first division resonator P1a has neither the resonant frequency nor the anti-resonant frequency within the passband of the transmission filter 4. The first division resonator P1a discharges the input signal to the ground potential at the resonant frequency. Accordingly, attenuation is able to be increased at the resonant frequency of the first division resonator P1a. Consequently, out-of-band attenuation of the transmission filter 4 is also able to be increased.

Preferably, the resonant frequency of the first division resonator P1a is set to the passband of the reception filter 5, that is, within the reception band. With this configuration, attenuation of the transmission filter 4 is able to be increased in the reception band. Consequently, isolation characteristics between the transmission filter and the reception filter are able to be improved.

In addition, if noise from the amplifier 6 enters the reception filter 5 via the transmission filter 4, the reception sensitivity possibly decreases. When the resonant frequency of the first division resonator P1a is set to the reception band as described above, it becomes less likely that noise from the amplifier 6 enters the reception filter 5 side.

As described above, the resonant frequency and the anti-resonant frequency of the first division resonator P1a are located outside the passband of the transmission filter 4, and the anti-resonant frequencies of the parallel-arm resonators P2 and P3 are within the passband. Thus, impedance matching is able to be favorably achieved, and the input impedance of the transmission filter 4 seen from the input terminal 4a, which is the transmission terminal, is able to be reduced to be about 45Ω or lower, for example.

The output impedance of the transmission filter 4 seen from the output terminal 4b is about 50Ω, for example. That is, the input impedance of the transmission filter 4 seen from the input terminal 4a is preferably set to be lower than the output impedance of the transmission filter 4 seen from the output terminal 4b.

With this configuration, impedance matching is able to be effectively achieved between the amplifier 6 having an output impedance lower than about 50Ω and the transmission filter 4 that is connected to the amplifier 6 and has an input impedance of about 45Ω or lower, for example.

Out of the first and second division resonators P1a and P1b, which are the plurality of division resonators, the first division resonator P1a having a resonant frequency and an anti-resonant frequency that are located outside the passband of the transmission filter 4 is located closer to the input terminal 4a.

A specific example will be described next.

An example in which a preferred embodiment of the present invention is applied to a Band 13 duplexer will be described. In Band 13, the transmission band is from 777 MHz to 787 MHz and the reception band is from 746 MHz to 756 MHz.

The electrode finger pitch, the overlap width, and the number of pairs of electrode fingers of a transmission filter of a duplexer according to the example are set as illustrated in Table 1.

TABLE 1

|  | P1a | P1b | P2 | P3 | S1 | S2 | S3 | S4 | S5 |
|---|---|---|---|---|---|---|---|---|---|
| Electrode finger pitch (μm) | 2.215 | 2.533 | 2.538 | 2.548 | 2.453 | 2.448 | 2.410 | 2.436 | 2.453 |
| Overlap width (μm) | 63 | 99 | 107 | 163 | 48 | 48 | 74 | 58 | 103 |
| The number of pairs | 70 | 70 | 120 | 120 | 120 | 120 | 65 | 121 | 74 |

As is apparent from Table 1, the electrode finger pitch of the first division resonator P1a preferably is set to about 2.215 μm and the electrode finger pitch of the second division resonator P1b preferably is set to 2.533 μm in this preferred embodiment, for example. The first division resonator P1a and the second division resonator P1b preferably include an equal number of pairs of electrode fingers.

The electrode finger pitch of the parallel-arm resonator P2 and the electrode finger pitch of the parallel-arm resonator P3 are preferably set to about 2.538 μm and about 2.548 μm, respectively, for example.

The first division resonator P1a has a resonant frequency of about 856 MHz and an anti-resonant frequency of about 882 MHz, for example.

For comparison, a duplexer according to a first comparative example and a duplexer according to a second comparative example configured in the following manner are prepared. In the first comparative example, a parallel-arm resonator P1x having design parameters illustrated in Table 2 is used in place of the first and second division resonators P1a and P1b.

TABLE 2

|  | P1x |
|---|---|
| Electrode finger pitch (μm) | 2.543 |
| Overlap width (μm) | 162 |
| The number of pairs | 70 |

As is apparent from Table 2, the parallel-arm resonator P1x according to the first comparative example has an electrode finger pitch of 2.543 μm and has a resonant frequency of 762 MHz and an anti-resonant frequency of 786 MHz. Accordingly, the parallel-arm resonator P1x forms the passband. In addition, the parallel-arm resonator P1x has an electrode-finger overlap width of 162 μm, which is twice as large as that of the first and second division resonators P1a and P1b according to the example. In other words, the size of the parallel-arm resonator P1x according to the first comparative example is equivalent to the sum of the sizes of the first division resonator P1a and the second division resonator P1b.

In the second comparative example, a parallel-arm resonator P1y illustrated in Table 3 is used in place of the first and second division resonators P1a and P1b.

TABLE 3

|  | P1y |
|---|---|
| Electrode finger pitch (μm) | 2.044 |
| Overlap width (μm) | 41 |
| The number of pairs | 70 |

The parallel-arm resonator P1y according to Table 3 has an electrode finger pitch of 2.044 μm and has a resonant frequency of 910 MHz and an anti-resonant frequency of 937 MHz. This parallel-arm resonator P1y has the resonant frequency and the anti-resonant frequency that are located outside the passband of the transmission filter 4.

In addition, in the second comparative example, the overlap width of the parallel-arm resonator P1y is reduced to 41 μm, and the electrode finger pitch is reduced to 2.044 μm.

Figure 5:
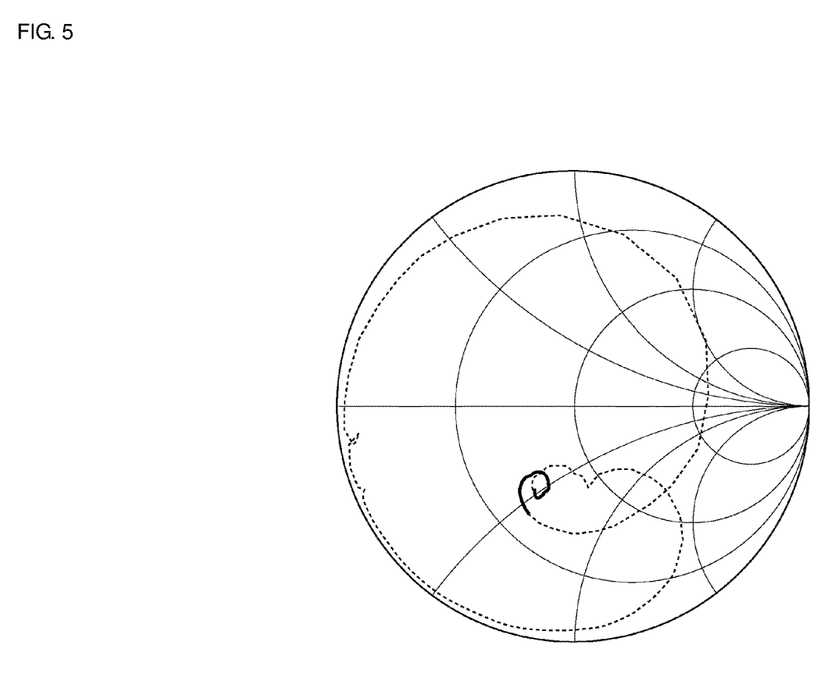
FIG. 5 is an impedance Smith chart illustrating impedance characteristics at a transmission end of the duplexer according to the first preferred embodiment of the present invention.
Figure 6:
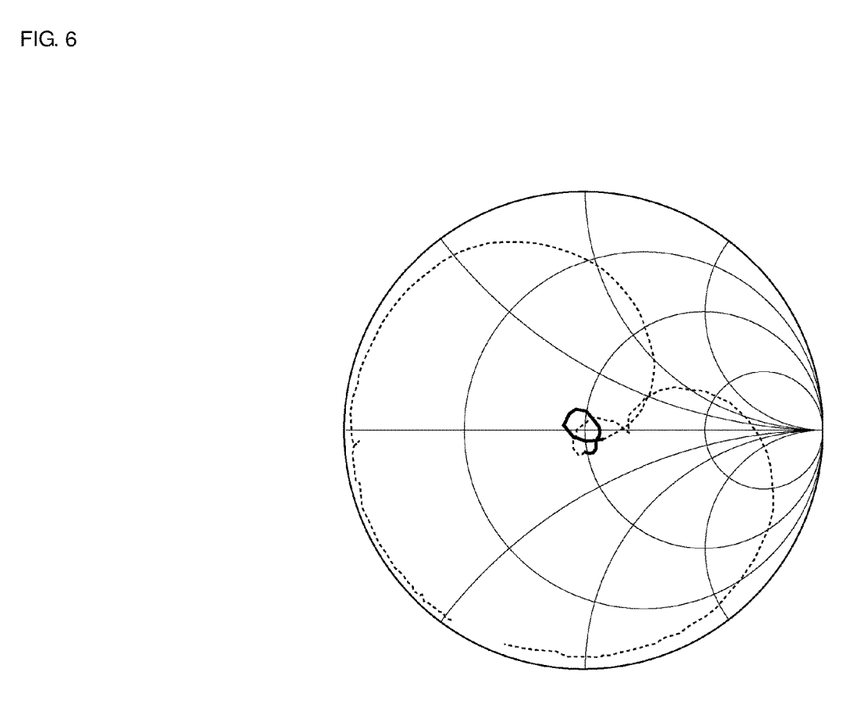
FIG. 6 is an impedance Smith chart illustrating impedance characteristics at a transmission end of a duplexer according to a first comparative example.
Figure 7:
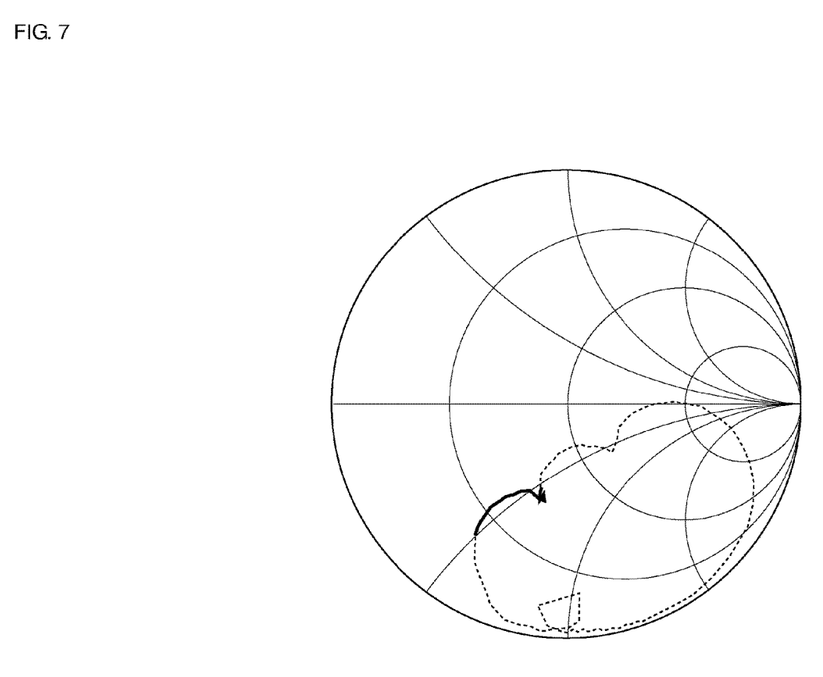
FIG. 7 is an impedance Smith chart illustrating impedance characteristics at a transmission end of a duplexer according to a second comparative example.

FIG. 5 is an impedance Smith chart illustrating the impedance characteristics at the transmission end, that is, the input terminal 4a, in the example. FIGS. 6 and 7 are impedance Smith charts illustrating the impedance characteristics at the input terminal of the transmission filter in the first comparative example and the second comparative example, respectively. In FIGS. 5 to 7, a thick line portion corresponds to the passband of the transmission filter.

Input-terminal impedance values at frequencies of 777 MHz, 782 MHz, and 787 MHZ at the input terminal that are read from FIGS. 5 to 7 are respectively shown in Tables 4 to 6 below.

TABLE 4

| Example | Impedance (Ω) | | |
|---|---|---|---|
| Frequency (MHz) | Real part | Imaginary part | Combined |
| 777 | 23.5 | −28.0 | 36.5 |
| 782 | 33.6 | −24.3 | 41.4 |
| 787 | 28.0 | −23.7 | 36.7 |

TABLE 5

| First Comparative Example | Impedance (Ω) | | |
|---|---|---|---|
| Frequency (MHz) | Real part | Imaginary part | Combined |
| 777 | 57.0 | −4.5 | 57.2 |
| 782 | 52.5 | 6.4 | 52.9 |
| 787 | 47.6 | −10.1 | 48.7 |

TABLE 6

| Second Comparative Example | Impedance (Ω) | | |
|---|---|---|---|
| Frequency (MHz) | Real part | Imaginary part | Combined |
| 777 | 12.4 | −24.7 | 27.7 |
| 782 | 29.2 | −27.8 | 40.4 |
| 787 | 31.3 | −25.8 | 40.6 |

As illustrated in FIG. 5 and Table 4, in the example, the impedance of the transmission filter seen from the input terminal 4a in the transmission band is less than about 50Ω, and a variation in impedance in the passband is small.

In contrast, in the first comparative example illustrated in FIG. 6 and Table 5, the variation is small in the passband. However, the impedance of the transmission filter seen from the input terminal is approximately 50Ω, and thus the impedance is not reduced.

In addition, in the second comparative example illustrated in FIG. 7 and Table 6, the impedance is reduced to be lower than about 50Ω in the passband. That is, the impedance is able to be reduced by the use of a single parallel-arm resonator P1y as capacitance. However, the variation in impedance in the passband is larger in the second comparative example than in the example. Accordingly, it is difficult to achieve favorable impedance matching with the amplifier in the entire passband.

The elastic wave filter module 7 according to the present preferred embodiment preferably does not include a matching circuit; however, the elastic wave filter module 7 may include a matching circuit 31 between the input terminal 4a and the amplifier 6 as indicated by a dash line in FIG. 2. Even in this case, since the impedance is reduced by the first division resonator P1a, the matching circuit 31 is able to be formed as a component much smaller than a conventional matching circuit for impedance matching. Accordingly, the matching circuit is able to be simplified and reduced in dimensions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter including a passband, comprising:
an input terminal;
an output terminal;
a series-arm resonator provided at a series arm connecting the input terminal and the output terminal to each other; and
a plurality of parallel-arm resonators provided at respective parallel-arms each connecting the series arm and a ground potential to each other; wherein
each of the series-arm resonator and the plurality of parallel-arm resonators is an elastic wave resonator;
the plurality of parallel-arm resonators include an input-terminal-side parallel-arm resonator located closest to the input terminal;
the input-terminal-side parallel-arm resonator includes a plurality of division resonators connected in parallel;
at least one division resonator among the plurality of division resonators has a resonant frequency and an anti-resonant frequency that are located outside the passband;
remaining ones of the plurality of division resonators other than the at least one division resonator and remaining ones of the plurality of parallel-arm resonators other than the input-terminal-side parallel-arm resonator each have an anti-resonant frequency that is located within the passband; and
the resonant frequency of the at least one division resonator having the resonant frequency and the anti-resonant frequency that are located outside the passband is located within a passband of a second filter connected to the ladder filter.

2. The ladder filter according to claim 1, wherein the at least one division resonator has an electrode finger pitch that is different from electrode finger pitches of the remaining ones of the plurality of division resonators and the remaining ones of the plurality of parallel-arm resonators.

3. The ladder filter according to claim 1, further comprising:
a piezoelectric substrate; and
a plurality of IDT electrodes disposed on the piezoelectric substrate.

4. The ladder filter according to claim 1, wherein an impedance of the ladder filter seen from the input terminal is lower than an impedance of the ladder filter seen from the output terminal.

5. An elastic wave filter module comprising:
a ladder filter with a passband and including:
an input terminal;
an output terminal;
a series-arm resonator provided at a series arm connecting the input terminal and the output terminal to each other; and
a plurality of parallel-arm resonators provided at respective parallel-arms each connecting the series arm and a ground potential to each other; wherein
each of the series-arm resonator and the plurality of parallel-arm resonators is an elastic wave resonator;
the plurality of parallel-arm resonators include an input-terminal-side parallel-arm resonator located closest to the input terminal;
the input-terminal-side parallel-arm resonator includes a plurality of division resonators connected in parallel;
at least one division resonator among the plurality of division resonators has a resonant frequency and an anti-resonant frequency that are located outside the passband;
remaining ones of the plurality of division resonators other than the at least one division resonator and remaining ones of the plurality of parallel-arm resonators other than the input-terminal-side parallel-arm resonator each have an anti-resonant frequency that is located within the passband; and
the resonant frequency of the at least one division resonator having the resonant frequency and the anti-resonant frequency that are located outside the passband is located within a passband of a second filter connected to the ladder filter; and an amplifier is connected to the input terminal of the ladder filter.

6. The elastic wave filter module according to claim 5, wherein the ladder filter is a first electronic component chip including the piezoelectric substrate, and the amplifier is a second electronic component chip including an amplifier substrate.

7. The elastic wave filter module according to claim 6, wherein the first electronic component chip and the second electronic component chip are mounted on a case substrate.

8. The elastic wave filter module according to claim 5, further comprising a matching circuit connected between the ladder filter and the amplifier.

9. The elastic wave filter module according to claim 5, wherein the at least one division resonator has an electrode finger pitch that is different from electrode finger pitches of the remaining ones of the plurality of division resonators and the remaining ones of the plurality of parallel-arm resonators.

10. The elastic wave filter module according to claim 5, wherein the ladder filter further includes:
a piezoelectric substrate; and
a plurality of IDT electrodes disposed on the piezoelectric substrate.

11. The elastic wave filter module according to claim 5, wherein an impedance of the ladder filter seen from the input terminal is lower than an impedance of the ladder filter seen from the output terminal.

12. A duplexer comprising:
a transmission filter including an elastic wave filter module that includes a ladder filter with a passband; and
a reception filter; wherein
the ladder filter includes:
an input terminal;
an output terminal;
a series-arm resonator provided at a series arm connecting the input terminal and the output terminal to each other; and
a plurality of parallel-arm resonators provided at respective parallel-arms each connecting the series arm and a ground potential to each other; wherein
each of the series-arm resonator and the plurality of parallel-arm resonators is an elastic wave resonator;
the plurality of parallel-arm resonators include an input-terminal-side parallel-arm resonator located closest to the input terminal;
the input-terminal-side parallel-arm resonator includes a plurality of division resonators connected in parallel;
at least one division resonator among the plurality of division resonators has a resonant frequency and an anti-resonant frequency that are located outside the passband;
remaining ones of the plurality of division resonators other than the at least one division resonator and remaining ones of the plurality of parallel-arm resonators other than the input-terminal-side parallel-arm resonator each have an anti-resonant frequency that is located within the passband; and
the resonant frequency of the at least one division resonator having the resonant frequency and the anti-resonant frequency that are located outside the passband is located within a passband of the reception filter; and
an amplifier is connected to the input terminal of the ladder filter.

13. The duplexer according to claim 12, wherein the ladder filter is a first electronic component chip including the piezoelectric substrate, and the amplifier is a second electronic component chip including an amplifier substrate.

14. The duplexer according to claim 13, wherein the first electronic component chip and the second electronic component chip are mounted on a case substrate.

15. The duplexer according to claim 12, further comprising a matching circuit connected between the ladder filter and the amplifier.

16. The duplexer according to claim 12, wherein the at least one division resonator has an electrode finger pitch that is different from electrode finger pitches of the remaining ones of the plurality of division resonators and the remaining ones of the plurality of parallel-arm resonators.

17. The duplexer according to claim 12, wherein the ladder filter further includes:
a piezoelectric substrate; and
a plurality of IDT electrodes disposed on the piezoelectric substrate.

18. The duplexer according to claim 12, wherein an impedance of the ladder filter seen from the input terminal is lower than an impedance of the ladder filter seen from the output terminal.

* * * * *